United States Patent
Rahman et al.

(10) Patent No.: US 10,770,651 B2
(45) Date of Patent: Sep. 8, 2020

(54) PERPENDICULAR SPIN TRANSFER TORQUE MEMORY (PSTTM) DEVICES WITH ENHANCED PERPENDICULAR ANISOTROPY AND METHODS TO FORM SAME

(71) Applicant: Intel Corporation, Santa Clara, CA (US)

(72) Inventors: MD Tofizur Rahman, Portland, OR (US); Christopher J. Wiegand, Portland, OR (US); Kaan Oguz, Beaverton, OR (US); Daniel G. Ouellette, Portland, OR (US); Brian Maertz, Santa Barbara, CA (US); Kevin P. O'Brien, Portland, OR (US); Mark L. Doczy, Beaverton, OR (US); Brian S. Doyle, Portland, OR (US); Oleg Golonzka, Beaverton, OR (US); Tahir Ghani, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 16/463,326

(22) PCT Filed: Dec. 30, 2016

(86) PCT No.: PCT/US2016/069528
§ 371 (c)(1),
(2) Date: May 22, 2019

(87) PCT Pub. No.: WO2018/125221
PCT Pub. Date: Jul. 5, 2018

(65) Prior Publication Data
US 2019/0378972 A1    Dec. 12, 2019

(51) Int. Cl.
*H01L 27/22* (2006.01)
*H01L 43/02* (2006.01)
(Continued)

(52) U.S. Cl.
CPC ......... *H01L 43/02* (2013.01); *H01F 10/3254* (2013.01); *H01F 10/3272* (2013.01);
(Continued)

(58) Field of Classification Search
CPC ..... H01L 27/22; H01L 27/222; H01L 27/224; H01L 43/00; H01L 43/02; H01L 43/06;
(Continued)

(56) References Cited

U.S. PATENT DOCUMENTS

2008/0225583 A1    9/2008   Guo et al.
2012/0063218 A1*   3/2012   Huai ................. H01F 10/3286
                                                              365/171
(Continued)

OTHER PUBLICATIONS

International Search Report and Written Opinion for International Patent Application No. PCT/US2016/069528, dated Jul. 11, 2019, 10 pages.
(Continued)

*Primary Examiner* — Eduardo A Rodela
(74) *Attorney, Agent, or Firm* — Schwabe, Williamson & Wyatt, P.C.

(57) ABSTRACT

A material layer stack for a pSTTM device includes a fixed magnetic layer, a tunnel barrier disposed above the fixed magnetic layer and a free layer disposed on the tunnel barrier. The free layer further includes a stack of bilayers where an uppermost bilayer is capped by a magnetic layer including iron and where each of the bilayers in the free layer includes a non-magnetic layer such as Tungsten, Molybdenum disposed on the magnetic layer. In an embodiment, the non-magnetic layers have a combined thickness
(Continued)

that is less than 15% of a combined thickness of the magnetic layers in the stack of bilayers. A stack of bilayers including non-magnetic layers in the free layer can reduce the saturation magnetization of the material layer stack for the pSTTM device and subsequently increase the perpendicular magnetic anisotropy.

25 Claims, 7 Drawing Sheets

(51) Int. Cl.
  *H01F 10/32* (2006.01)
  *H01L 43/10* (2006.01)
  *H01L 43/12* (2006.01)
  *H01L 43/00* (2006.01)

(52) U.S. Cl.
  CPC ............ *H01L 27/22* (2013.01); *H01L 27/222* (2013.01); *H01L 27/224* (2013.01); *H01L 27/228* (2013.01); *H01L 43/00* (2013.01); *H01L 43/10* (2013.01); *H01L 43/12* (2013.01)

(58) Field of Classification Search
  CPC ... G11C 11/16; G11C 11/161; G11C 11/5607; G11C 15/02; G11C 14/0036; G11C 14/0081
  See application file for complete search history.

(56) References Cited

U.S. PATENT DOCUMENTS

| | | |
|---|---|---|
| 2013/0148418 A1 | 6/2013 | Luo et al. |
| 2014/0084398 A1 | 3/2014 | Oguz et al. |
| 2016/0284763 A1 | 9/2016 | Tahmasebi et al. |
| 2018/0287052 A1* | 10/2018 | Wang .................. G11C 11/1675 |

OTHER PUBLICATIONS

International Search Report and Written Opinion for International Patent Application No. PCT/US2016/069528 dated Sep. 20, 2017, 13 pgs.

* cited by examiner

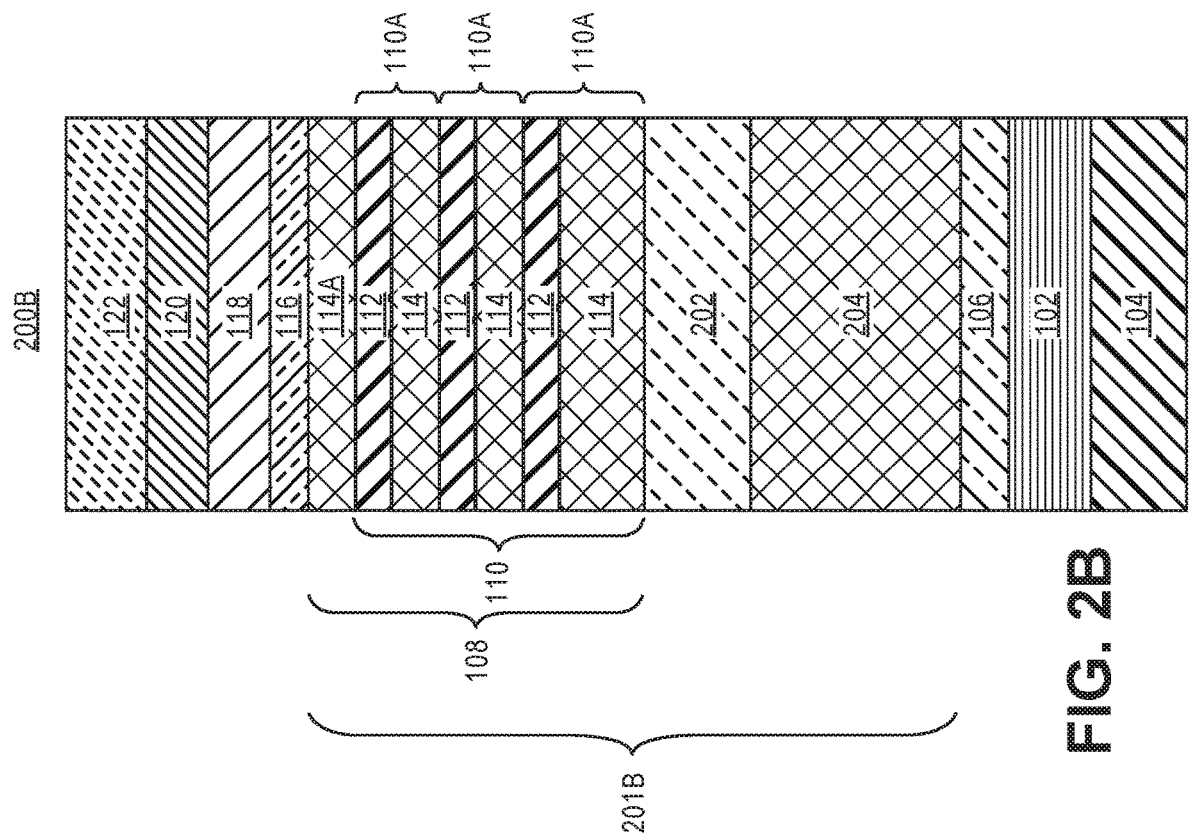
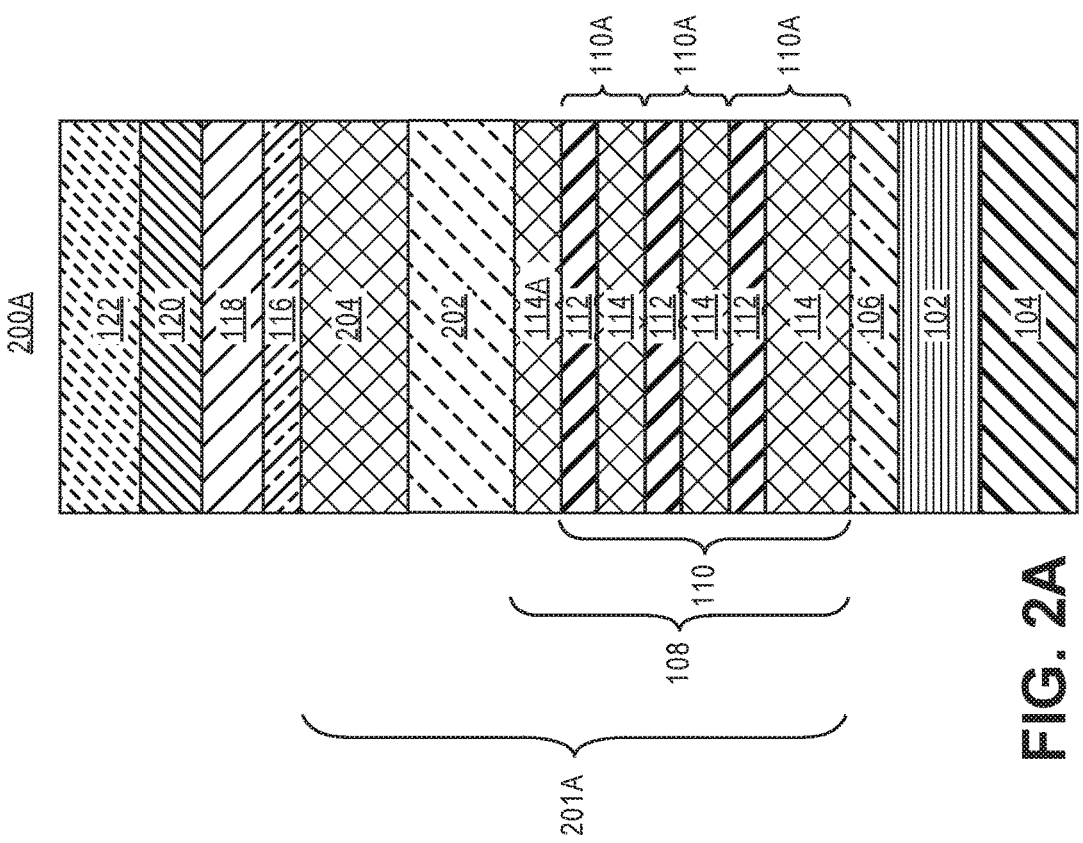

PERPENDICULAR SPIN TRANSFER TORQUE MEMORY (PSTTM) DEVICES WITH ENHANCED PERPENDICULAR ANISOTROPY AND METHODS TO FORM SAME

CROSS-REFERENCE TO RELATED APPLICATION

This patent application is a U.S. National Phase Application under 35 U.S.C. § 371 of International Application No. PCT/US2016/069528, filed Dec. 30, 2016, entitled "PERPENDICULAR SPIN TRANSFER TORQUE MEMORY (PSTTM) DEVICES WITH ENHANCED PERPENDICULAR ANISOTROPY AND METHODS TO FORM SAME," which designates the United States of America, the entire disclosure of which is hereby incorporated by reference in its entirety and for all purposes.

TECHNICAL FIELD

Embodiments of the invention are in the field of integrated circuit fabrication and, in particular, perpendicular spin transfer torque memory (pSTTM) devices with enhanced perpendicular anisotropy and methods to form same.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased functionality. The drive for ever-more functionality, however, is not without issue. It has become increasingly significant to rely heavily on innovative fabrication techniques to meet the exceedingly tight tolerance requirements imposed by scaling.

Non-volatile embedded memory with pSTTM devices can enable energy and computational efficiency. However, the technical challenges of assembling a pSTTM stack to form functional devices present formidable roadblocks to commercialization of this technology today. Specifically, reducing switching current in pSTTM devices without compromising tunnel magnetoresistance (TMR) and resistance-area (RA) are some important areas of process development. As such, significant improvements are needed in pSTTM stack development that address these challenges.

BRIEF DESCRIPTION OF THE DRAWINGS

FIGS. 2A-2C illustrate cross-sectional views of various pSTTM material layer stacks where a storage layer includes two free layers separated by a coupling layer and where one or more free layers includes a stack of bilayers.

FIG. 2A illustrates a cross-sectional view of a material layer stack for a pSTTM device, in accordance with an embodiment of the present invention.

FIG. 2B illustrates a cross-sectional view of a material layer stack for a pSTTM device, in accordance with an embodiment of the present invention.

FIG. 2C illustrates a cross-sectional view of a material layer stack for a pSTTM device, in accordance with an embodiment of the present invention.

FIG. 4A illustrates a cross-sectional view of the formation of a first free layer including a stack of bilayers on a tunnel barrier.

FIG. 4B illustrates a cross-sectional view of the formation of a second free layer including a stack of bilayers above the first free layer.

FIG. 4C illustrates a cross-sectional view of the formation of a protective layer, an oxide layer, a capping layer and a top electrode on the second free layer.

DESCRIPTION OF THE EMBODIMENTS

Figure 1:
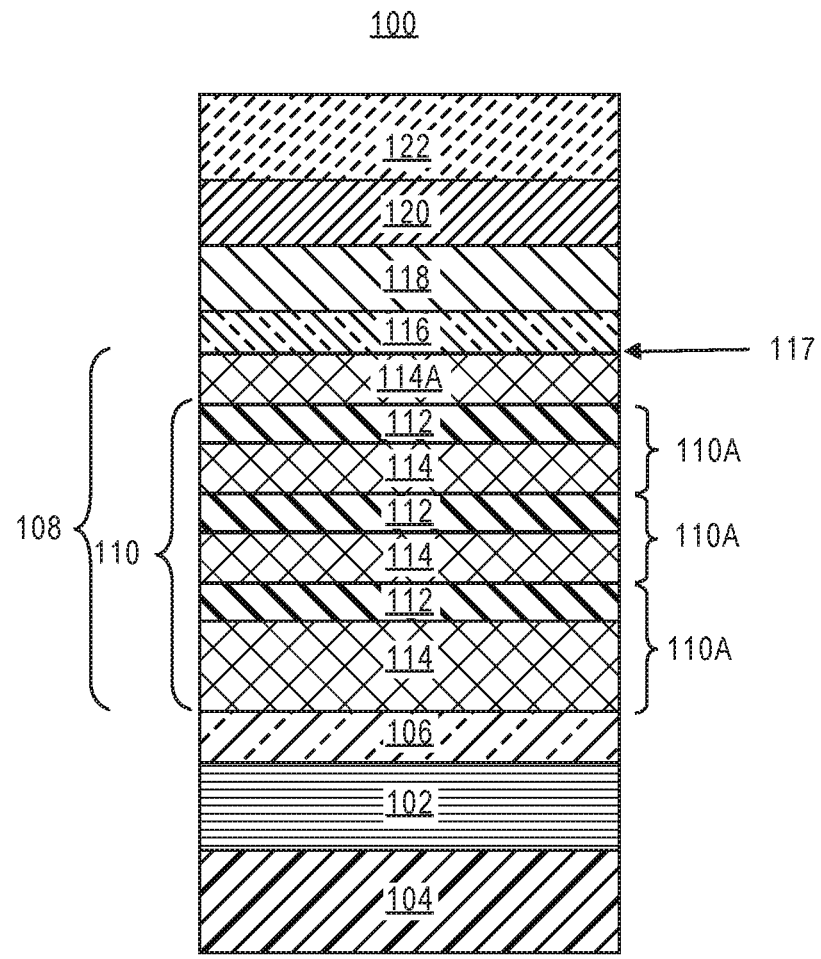
FIG. 1 illustrates a cross-sectional view of a material layer stack for a pSTTM device, in accordance with an embodiment of the present invention.

Perpendicular-spin transfer torque memory (pSTTM) devices with enhanced perpendicular anisotropy and methods of fabrication are described. In the following description, numerous specific details are set forth, such as novel structural schemes and detailed fabrication methods in order to provide a thorough understanding of embodiments of the present invention. It will be apparent to one skilled in the art that embodiments of the present invention may be practiced without these specific details. In other instances, well-known features, such as transistor operations and switching operations associated with embedded memory, are described in lesser detail in order to not unnecessarily obscure embodiments of the present invention. Furthermore, it is to be understood that the various embodiments shown in the Figures are illustrative representations and are not necessarily drawn to scale.

A pSTTM device functions as a variable resistor where the resistance of the device may switch between a high resistance state and a low resistance state. The resistance state of a pSTTM device is defined by the relative orientation of magnetization of two magnetic layers (fixed and free) that are separated by a tunnel barrier. When the magnetization of the two magnetic layers have orientations that are in the same direction the pSTTM device is said to be in a low resistance state. Conversely, when the magnetization of the two magnetic layers have orientations that in opposite directions the pSTTM device is said to be in a high resistance state. In an embodiment, the resistance switching is brought about by passing a critical amount of spin polarized current through the pSTTM device so as to influence the orientation of the magnetization of the free layer to align with the magnetization of the fixed magnetic layer. By changing the direction of the current, the magnetization in the free layer may be reversed relative to that of the fixed magnetic layer. Since the free layer does not need power to retain relative orientation of magnetization, the resistance state of the pSTTM device is retained even when there is no power applied to the pSTTM device. For this reason, pSTTM belongs to a class of memory known as non-volatile memory.

Integrating a non-volatile memory device such as a STTM device onto an access transistor enables the formation of embedded memory for system on chip or for other applications. However, approaches to integrate an STTM device onto an access transistor presents challenges that have become far more formidable with scaling. Examples of such challenges range from reducing switching current, improving thermal stability of STTM devices against perturbing forces, reducing retention loss and enabling patterning of STTM devices at less than 40 nm feature sizes. As scaling continues, the need for smaller memory devices to fit into a scaled cell size has driven the industry in the direction of "perpendicular" STTM or pSTTM. Fortunately, while pSTTM devices have higher stability for small memory element sizes, reducing switching current along with improving other device parameters continues to be a challenge.

A pSTTM device typically includes a multilayer stack of magnetic and non-magnetic materials. The multilayer stack is engineered to possess perpendicular anisotropy. However, the strength of the perpendicular anisotropy depends on the saturation magnetization of the free layer. A simple embodiment of a pSTTM device includes a fixed or reference magnetic layer, a tunnel barrier disposed on the fixed magnetic layer and a free layer disposed on the tunnel barrier. In an embodiment, the free layer can include a stack of alternating layers of magnetic layers and non-magnetic layer. In one such embodiment, the stack of alternating layers of magnetic layers and non-magnetic layers can decrease the saturation magnetization of the free layer. Because saturation magnetization is a function of the net magnetic moment of the atoms of the magnetic layers in the free layer, the inclusion of non-magnetic layer between magnetic layers can reduce the net magnetic moment and hence the saturation magnetization of the free layer. Moreover, since effective perpendicular anisotropy of a free layer increases when saturation magnetization is reduced, the presence of non-magnetic layers in the free layer can lead to enhanced perpendicular anisotropy.

In accordance with embodiments of the present invention, a material layer stack for a pSTTM device includes a fixed magnetic layer, a tunnel barrier disposed above the fixed magnetic layer and a free layer disposed on the tunnel barrier. The free layer includes a stack of bilayers where each of the bilayers includes a non-magnetic layer such as Mo or W disposed on a magnetic layer such as CoFeB. An additional magnetic layer, that is also part of the free layer, is disposed on the uppermost bilayer stack. In an embodiment, the non-magnetic layers are sub-monolayers and can be sufficiently thick enough to enable the magnetic and non-magnetic layers in the stack of bilayers to maintain layer integrity. In another embodiment, the non-magnetic layers are thin enough to be discontinuous. In an embodiment, the non-magnetic layers in the stack of bilayers have a combined total thickness that is less than 15% of the combined total thickness of all of the magnetic layers in the free layer. The stack of bilayers of magnetic and non-magnetic layers in the free layer reduces saturation magnetization of the free layer and increases perpendicular magnetic anisotropy.

FIG. 1 illustrates a cross-sectional illustration of a material layer stack 100 for a pSTTM device in accordance with an embodiment of the present invention. The material layer stack 100 includes a fixed magnetic layer 102 having a perpendicular anisotropy, disposed on a bottom electrode layer 104. A tunnel barrier 106 which includes an MgO is disposed on the fixed magnetic layer 102. The material layer stack 100 further includes a free layer 108 disposed on the tunnel barrier 106.

The free layer 108 includes a stack of bilayers 110, where each of the bilayers 110A includes a non-magnetic layer 112 disposed on a magnetic layer 114 and where an uppermost bilayer 110A is capped by an uppermost magnetic layer 114A. Each bilayer 110 brings about a saturation magnetization reduction in the free layer 108. In an embodiment, the total number of bilayers 110A in the stack of bilayers 110 is at least 2. In an embodiment, the total number of bilayers 110A in the stack of bilayers 110 is between 2-12. In an embodiment, the combined total thickness of non-magnetic layers 112 in the stack of bilayers 110 is less than 15% of the combined total thickness of the magnetic layers 114 in the stack of bilayers 110. In an embodiment, the combined thickness of non-magnetic layer 112 in the stack of bilayers 110 is less than 5% of the combined thickness of the magnetic layers 114 and the uppermost magnetic layer 114A in the stack of bilayers 110. In an embodiment, the free layer 108 has a thickness that is at least 1 nm but less than 3 nm.

In an embodiment, the magnetic layers 114 in the free layer 108 include an alloy such as CoFe and CoFeB. In an embodiment the magnetic layers 114 is CoFeB. In an embodiment, the magnetic layer 114 in a lowermost bilayer 110A that is in contact with the tunnel barrier 106 has a thickness that is greater than the thickness of any of the other magnetic layers 114 in the free layer 108. In an embodiment, the magnetic layer 114 in the lowermost bilayer 110A has a thickness that is at least 0.45 nm and each of the other magnetic layers 114 in the free layer 108 have a thickness of at least 0.15 nm. In an embodiment, the magnetic layer 114 that is contact with the tunnel barrier 106 has a thickness that is between 1 to 6 times greater than the thickness of each of the other magnetic layers 114 or 114A. The magnetic layer 114 disposed on the tunnel barrier 106 is sufficiently thick enough to prevent diffusion of material from the non-magnetic layer 112 into the tunnel barrier 106. In an embodiment, combined thickness of each of the magnetic layer 114 in the free layer 108 is at least 0.6 nm but less than 2.85 nm.

In an embodiment, the non-magnetic layer 112 includes a metal selected from the group consisting of but not limited to molybdenum, ruthenium, tungsten, tantalum and aluminum, Hafnium. In an embodiment, the non-magnetic layer 112 is a sub-monolayer. In an embodiment, each of the non-magnetic layers 112 are sufficiently thick enough to remain as distinct layers in the stack of bilayers 110, In another embodiment, the non-magnetic layers 112 are thin enough to be discontinuous. In an embodiment, the non-magnetic layers 112 are at least 0.01 nm. In an embodiment, the combined thickness of the non-magnetic layers 112 in the stack of bilayers 110 is at least 0.05 nm. Furthermore, the non-magnetic layers 112 have thicknesses that are insufficient to act as coupling layers between each magnetic layer 114. In an embodiment, the non-magnetic layers 112 are less than 0.025 nm, a thickness that is less that sufficient to enhance perpendicular interfacial anisotropy in the stack of bilayers 110.

In an embodiment, the fixed magnetic layer 102 is composed of alloys metals such as but not limited to Co, Fe and B and has a thickness suitable for maintaining a fixed perpendicular magnetization. In one embodiment, the fixed magnetic layer 102 is composed of a single layer of cobalt iron boron (CoFeB). In an embodiment the fixed magnetic layer 102 has a thickness that is between 2-3 nm.

In an embodiment, the tunnel barrier 106 is composed of a material suitable for allowing electron current having a majority spin to pass through the tunnel barrier 106, while impeding at least to some extent electron current having a minority spin from passing through the tunnel barrier 106. Thus, the tunnel barrier 106 (or spin filter layer) may also be referred to as a tunneling layer for electron current of a particular spin orientation. In one embodiment, the tunnel barrier 106 includes a material such as, but not limited to, magnesium oxide (MgO) or aluminum oxide ($Al_2O_3$). In one embodiment, the tunnel barrier 106 is MgO and has a thickness of approximately 1 to 2 nm.

In an embodiment, the material layer stack 100 further includes an oxide layer 116 disposed on the free layer 108. In an embodiment, the oxide layer 116 includes an MgO. In an embodiment, the oxide layer 116 has a thickness that is between 0.3 nm-1.5 nm. The oxide provides a source of oxygen that enables oxygen-iron hybridization at an interface 117 located between an uppermost surface of the free layer 108 and a lowermost surface of the oxide layer 116. The oxygen-iron hybridization in the interface 117 enables interfacial perpendicular anisotropy in the free layer 108.

In an embodiment, a protective layer 118 is disposed on the oxide layer 116 as illustrated in FIG. 1. The protective layer 118 acts as a protective barrier for the oxide layer 116 against direct physical sputter damage during the formation of a subsequent layer such as a conductive capping layer 120. In an embodiment, the protective layer 118 has a thickness between 0.3 nm-1.5 nm. In an embodiment, the protective layer 118 has a stoichiometry of the cobalt and the iron in the film and a thickness to make the CoFeB non-magnetic and additionally, a thickness sufficient to prevent sputter damage the deposition of the conductive capping layer 120.

In an embodiment, a conductive capping layer 120 is disposed on the protective layer 118 as illustrated in FIG. 1. In an embodiment, the conductive capping layer 120 includes a metal such as, but not limited to, osmium, rhodium, molybdenum, ruthenium, tungsten, iridium, gold, palladium or platinum. In an embodiment, the conductive capping layer 120 is molybdenum. In an embodiment the conductive capping layer 120 includes a metal that has an oxygen affinity less than the oxygen affinity of tantalum. In an embodiment, the conductive capping layer 120 has a thickness that is between 1.5 nm-6 nm.

In an embodiment, the conductive capping layer 120 can include a metal having a low oxygen affinity. Because oxygen atoms from the conductive capping layer 120 can diffuse through the protective layer 118 and react with the metal (oxidation) in the interface 117, a metal with a low oxygen affinity is utilized to form a conductive capping layer 120.

In an embodiment, the bottom electrode layer 104 is composed of a material or stack of materials suitable for electrically contacting the fixed magnetic layer 102 side of the material layer stack 100. In an embodiment, the bottom electrode layer 104 is a topographically smooth electrode. In a specific embodiment, the bottom electrode layer 104 is composed of Ru layers interleaved with Ta layers. In another embodiment, the bottom electrode layer 104 is TiN. In an embodiment, the bottom electrode layer 104 has a thickness between 20 nm-50 nm.

In an embodiment, the top electrode layer 122 includes a material such as Ta or TiN. In an embodiment, the top electrode layer 122 includes a material suitable to provide a hardmask for etching the material layer stack 100 to form pSTTM devices. In an embodiment, top electrode layer 122 includes a material that can act as a contact electrode. In an embodiment, the top electrode layer 122 has a thickness between 30-70 nm. In an embodiment, the top electrode and the bottom electrode layer 104 include a same metal such as Ta or TiN.

Figure 2C:
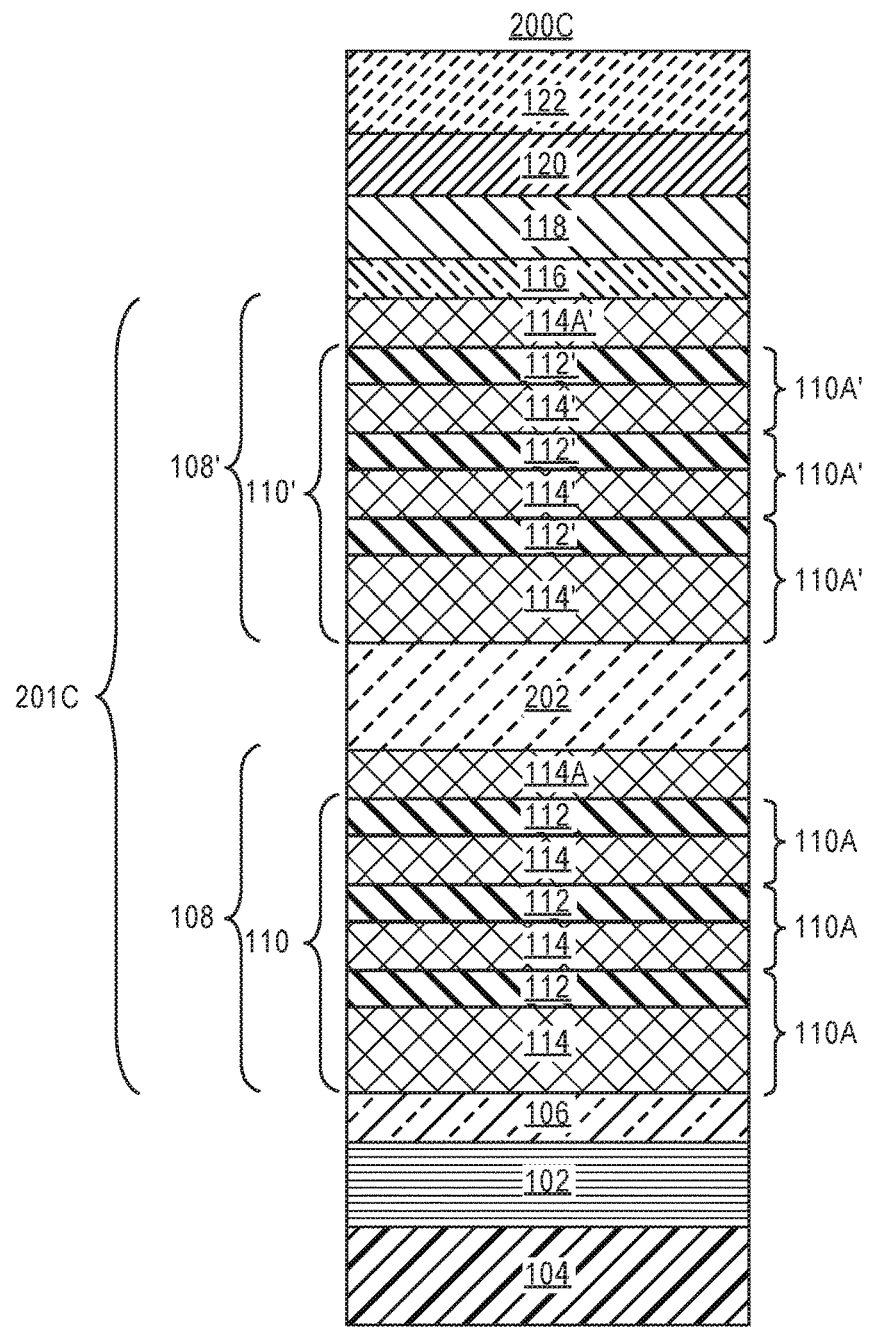

FIGS. 2A-2C illustrate cross-sectional views of various pSTTM material layer stacks where a storage layer includes two free layers separated by a coupling layer and wherein one or more free layers includes a stack of bilayers.

FIG. 2A illustrates a cross sectional view of a pSTTM material layer stack 200A with a storage layer 201A. In an embodiment, the storage layer 201A includes a free layer 108 and a second free layer 204 separated by a coupling layer 202 directly in between. In an embodiment, the free layer 108, disposed on the tunnel barrier 106, is similarly configured to the free layer 108 described in association with FIG. 1. In an embodiment, the number of stacks of bilayers 110 in free layer 108 is between 2-12.

In an embodiment, the coupling layer 202 includes a transition metal such as, but not limited to, tungsten, molybdenum, vanadium, niobium or iridium. In an embodiment, the coupling layer 202 is a same metal as the metal of the non-magnetic layers 112. In an embodiment, the coupling layer 202 is a different metal than the metal of the non-magnetic layers 112.

The coupling layer 202 is a single layer of non-magnetic material similar to the non-magnetic layers 112 in the free layer 108. However, the coupling layer 202 is disposed between the free layer 108 and the second free layer 204 to increase the interfacial anisotropy of the storage layer 201A, whereas the purpose of the non-magnetic layers 112 is to reduce the saturation magnetization of the free layer 108. As such, the coupling layer 202 includes a metal and has a thickness sufficient to form a continuous layer and (a) provide interfacial anisotropy at the interface between the coupling layer 202 and the second free layer 204 and (b) provide interfacial anisotropy at the interface between the coupling layer 202 and the uppermost magnetic layer 114A of the free layer 108.

In an embodiment, the coupling layer 202 includes a transition metal such as, but not limited to, tungsten, molybdenum, vanadium, niobium or iridium. In an embodiment, the coupling layer 202 is a same metal as the metal of the non-magnetic layers 112. In an embodiment, the coupling layer 202 is a different metal than the metal of the non-magnetic layers 112.

In an embodiment, the coupling layer 202 has a thickness between 0.2 nm-0.7 nm. The coupling layer 202 is also thicker than each of the each of the non-magnetic layers 112 in the stack of bilayers 110, In an embodiment, the coupling layer 202 has a thickness that is between 10-60 times greater than the thickness of each of non-magnetic layers 112 in the free layer 108. In an embodiment, the coupling layer 202 has a thickness between 2-10 times greater than the combined thickness of the non-magnetic layer 112.

In an embodiment, the second free layer 204 is a single magnetic layer. The second free layer 204 is a weaker free magnet than the free layer 202 disposed above the coupling layer 108. In an embodiment, the second free layer 204 is CoFeB and has a thickness between 0.6 nm-1.5 nm. In an embodiment, the second free layer 204 has a thickness that is less than the combined total thickness of the magnetic layers 114 and the uppermost magnetic layer 114A in the free layer 108. In an embodiment, the magnetic layers 114, the uppermost magnetic layer 114A in the free layer 108 and the second free layer 204 are CoFeB. A compositionally iron rich CoFeB makes the magnetic anisotropy stronger. In one such embodiment, the CoFeB in the magnetic layer 114 has an 80% iron composition whereas the CoFeB in the second free layer 204 has a 75% iron composition.

FIG. 2B illustrates a material layer stack 200B where the second free layer 204, is now disposed directly on the tunnel barrier 106. The coupling layer 202 is disposed on the second free layer 204, and the free layer 108 is disposed on the coupling layer 202 as illustrated in FIG. 2B.

The coupling layer 202 of the storage layer 201B has a substantially similar material composition and thickness as the coupling layer 202 in the storage layer 201A, described in connection with FIG. 2A. In an embodiment, the thickness of the coupling layer 202 is between 2-8 times the combined total thicknesses of the non-magnetic layers 112 in the free layer 108 for similar reasons as described above.

In an embodiment, the free layer 108, disposed on the coupling layer 202, is similarly configured to the free layer 108 described in association with FIG. 1. In an embodiment, the number of stacks of bilayers 110 in free layer 108, in the storage layer 201B, is between 2-5. Referring to once again to FIG. 2B, the lowermost magnetic layer 114 in the stack of bilayers 110 is now disposed directly on the coupling layer 202. Because the lowermost magnetic layer 114 does not need to act as a diffusion barrier it can be as thin as 0.2 nm. In an embodiment, the thickness of each of the magnetic layers 11A and the uppermost magnetic layer 114A can be substantially similar. In an embodiment, the thickness of each of the magnetic layers 114 and 114A is 0.2 nm. In an embodiment, the magnetic layers 114 and the uppermost magnetic layer 114A have a combined total thickness between 0.6 nm-1.5 nm.

The second free layer 204 in the storage layer 201B is a stronger free magnet than the free layer 108 disposed above the coupling layer 202. In an embodiment, the second free layer 204 formed on the tunnel barrier 106 is compositionally more iron rich than the free layer 108. In an embodiment, the second free layer 204 is an iron rich $Co_{1-x}Fe_xB$, layer where X>0.75 and the free layer 108 is a $Co_{1-x}Fe_xB$, layer where X is less than or equal to 0.75. In an embodiment, the second free layer 204 is a single magnetic layer having a thickness between 1 nm-3 nm. In an embodiment, the second free layer 204 has a thickness that is greater than the combined total thickness of the magnetic layers 114 and the uppermost magnetic layer 114A in the storage layer 201B.

FIG. 2C illustrates cross-sectional view of a pSTTM material layer stack 200C with a storage layer 201C. In an embodiment, storage layer 201C includes free layer 108 disposed on the tunnel barrier 106, separated from a second free layer 108' by the coupling layer 202. The free layer 108 includes a stack of bilayers capped by the uppermost magnetic layer 114A and the second free layer 108' includes a second stack of bilayers 110' capped by an uppermost magnetic layer 114A' as illustrated in FIG. 2C. In an embodiment, the second free layer 108' is configured similarly to the free layer 108. In an embodiment, second free layer 108' includes a stack of bilayers 110' that is compositely similar to the stack of bilayers 110. In an embodiment, the stack of bilayers 110' includes a non-magnetic layer 112' disposed on a magnetic layer 114'.

The coupling layer 202 of the storage layer 201C has a substantially similar material composition and thickness as the coupling layer 202 in the storage layer 201A, described in connection with FIG. 2A. The coupling layer 202 is disposed between two free layers 108 and 108' to increase the perpendicular interfacial anisotropy of the storage layer 201C. In an embodiment, the coupling layer 202 has a thickness that is between 0.3 nm-0.7 nm to maintain perpendicular interfacial anisotropy. In an embodiment, each of the non-magnetic layers 112 and non-magnetic layer 112' have a thickness that is between 0.011-0.023 nm to help reduce the saturation magnetization. As such the ratio of the thickness of the coupling layer 202 to the non-magnetic layer 112 or non-magnetic layer 112' is at least 10:1.

In an embodiment, the thickness of the coupling layer 202 is between 1-10 times the combined total thickness of the non-magnetic layers 112' in the second free layer 108'. In an embodiment, the coupling layer 202 has a thickness that is between 1-6 times the combined thickness of the non-magnetic layer 112.

In an embodiment, the magnetic layers 114' are compositionally similar to the uppermost magnetic layer 114A'. In an embodiment, the magnetic layers 114' and uppermost magnetic layer 114A' are compositionally similar to the magnetic layers 114 and the uppermost magnetic layer 114A, respectively. In an embodiment, the magnetic layers 114' and the uppermost magnetic layer 114A' are CoFeB. In another embodiment, magnetic layers 114 and uppermost magnetic layer 114A include CoFeB that is compositionally iron rich compared to the CoFeB in the magnetic layer 114' and in the uppermost magnetic layer 114A'. In one such embodiment, the CoFeB in the magnetic layer 114 has an 80% iron composition whereas the CoFeB in the second magnetic layer 114' has a 75% iron composition.

In an embodiment, the magnetic layers 114 and the uppermost magnetic layer 114 have a combined total thickness that is greater than the combined total thickness of all the magnetic layers 114' the uppermost magnetic layer 114A'. In one such embodiment, the combined thickness of all the magnetic layers 114 and the uppermost magnetic layer 114A is between iron −2.85 nm and the combined thickness of all the magnetic layers 114' and the uppermost magnetic layer 114A' is between 0.6 nm and 1.9 nm. Additionally, as discussed above, the thickness of each of the magnetic layers 114' in the second free layer 108' which is disposed above the capping layer 202 can be substantially similar and have a thickness of at least 0.2 nm.

In an embodiment, the non-magnetic layer 112 and the non-magnetic layer 112' are selected from the group consisting of molybdenum, ruthenium, tungsten, tantalum and aluminum. In an embodiment, the non-magnetic layer 112 includes a same metal as the metal of the non-magnetic layer 112'. In a different embodiment, the non-magnetic layer 112 includes a metal that is different from the metal of the non-magnetic layer 112'. In an embodiment, the thickness of the non-magnetic layer 112 is substantially similar to the thickness of the non-magnetic layer 112'. In another embodiment, the thickness of the non-magnetic layer 112 is greater than the thickness of the non-magnetic layer 112'. In yet another embodiment, the thickness of the non-magnetic layer 112 is less than the thickness of the non-magnetic layer 112'.

In another embodiment, a storage layer 201C may include more than two free layers, such as the free layer 108, where one free layer is separated from the other by a coupling layer, such as a coupling layer 202, in between. In one such embodiment, each of the free layers may include a stack of bilayers, such as bilayers 110, capped by a magnetic layer such as a magnetic layer 114.

FIG. 2C illustrates cross-sectional view of a pSTTM material layer stack 200C with a storage layer 201C. In an embodiment, a free layer 108 which includes a stack of bilayers capped by the uppermost magnetic layer 114A disposed on the tunnel barrier 106. The coupling layer 202 is disposed on the uppermost magnetic layer 114A of the free layer 108. In an embodiment, a second free layer 108' is disposed on the coupling layer 202, where the second free layer 108' includes a second stack of bilayers 110' capped by an uppermost magnetic layer 114A'.

In an embodiment, the second free layer 108' is configured similarly the free layer 108. In an embodiment, second free layer 108' includes a stack of bilayers 110' that is compositely similar to the stack of bilayers 110. In an embodiment, the stack of bilayers 110' includes a non-magnetic layer 112' disposed on a magnetic layer 114'.

In an embodiment, the magnetic layers 114' are compositionally similar to the uppermost magnetic layer 114A'. In an embodiment, the magnetic layers 114' and uppermost magnetic layer 114A' are compositionally similar to the magnetic layers 114 and the uppermost magnetic layer 114A, respectively. In an embodiment, the magnetic layers 114' and the uppermost magnetic layer 114A' are CoFeB. In another embodiment, the magnetic material 114' has a CoFeB layer that is compositionally iron rich compared to the CoFeB in the magnetic layer 114'. In one such embodiment, the CoFeB in the magnetic layer 114 has an 80% iron composition whereas the CoFeB in the second magnetic layer 114' has a 75% iron composition.

In an embodiment, the magnetic layers 114 and the uppermost magnetic layer 114A have a combined total thickness that is greater than the combined total thickness of all the magnetic layers 114' the uppermost magnetic layer 114A'. In one such embodiment, the combined thickness of all the magnetic layers 114 and the uppermost magnetic layer 114 is between 1 nm-2.85 nm and the combined thickness of all the magnetic layers 114' and the uppermost magnetic layer 114' is between 0.6 nm and 1.9 nm. Additionally, as discussed above, the thickness of each of magnetic layers 114' in the second free layer 108' which is disposed above the capping layer 202 can be substantially similar and have a thickness of at least 0.2 nm.

In an embodiment, the non-magnetic layer 112 and the non-magnetic layer 112' are selected from the group consisting of molybdenum, ruthenium, tungsten, tantalum and aluminum. In an embodiment, the non-magnetic layer 112 includes a same metal as the metal of the non-magnetic layer 112'. In a different embodiment, the non-magnetic layer 112 includes a metal that is different from the metal of the non-magnetic layer 112'. In an embodiment, the thickness of the non-magnetic layer 112 is substantially similar to the thickness of the non-magnetic layer 112'. In another embodiment, the thickness of the non-magnetic layer 112 is greater than the thickness of the non-magnetic layer 112'.

Figure 3:
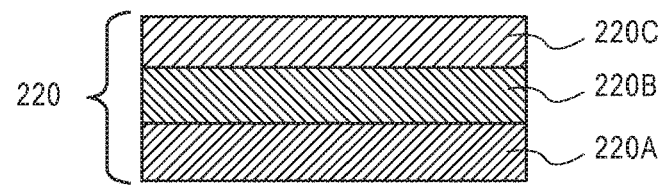
FIG. 3 illustrates a cross-sectional view of individual layers of a synthetic antiferromagnetic layer.

FIG. 3 illustrates a cross-sectional view of a synthetic antiferromagnetic (SAF) layer 220. In an embodiment, the SAF layer 220 includes a SAF non-magnetic layer 220B sandwiched between a first SAF magnetic layer 220A and a second SAF magnetic layer 220C. A SAF layer 220 may be disposed between the bottom electrode layer 104 and the fixed magnetic layer 102 in each of the material layer stack 200A, 200B or 200C. In an embodiment, the SAF first magnetic layer 220A includes a metal such, but limited to Co, Ni/Pt, Pd, a SAF non-magnetic layer 220B that is ruthenium and a second SAF magnetic layer 220C that is Co, Ni/Pt, Pd. Multilayers CoFeB. In an embodiment, a ruthenium based SAF non-magnetic layer 220B is limited to a thickness range of 4-9 Angstroms to ensure that the coupling between the first SAF magnetic layer 220A and the second SAF magnetic layer 220C is anti-ferromagnetic in nature.

Figure 4B:
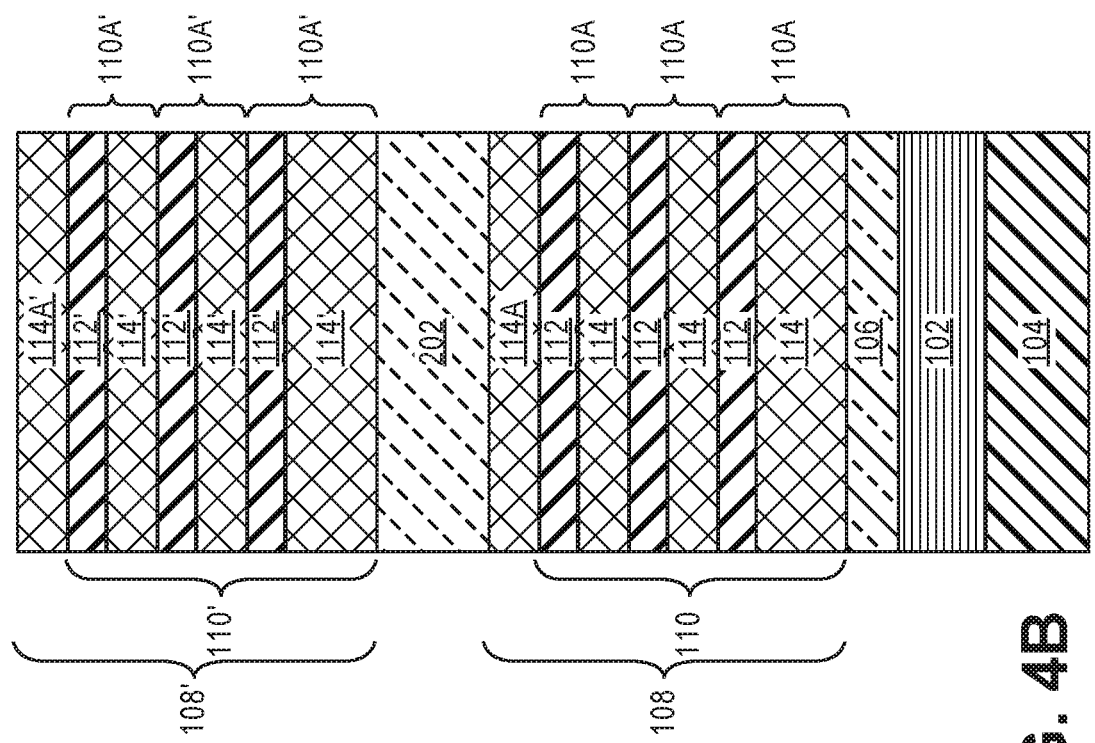
FIG. 4A-4C illustrate cross-sectional views representing various operations in a method of fabricating a pSTTM material layer stack.
Figure 4A:
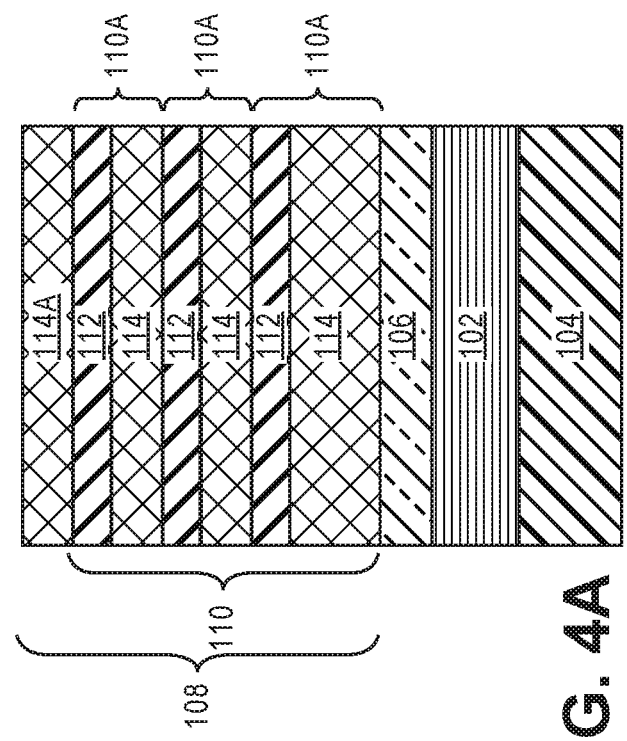
Figure 4C:
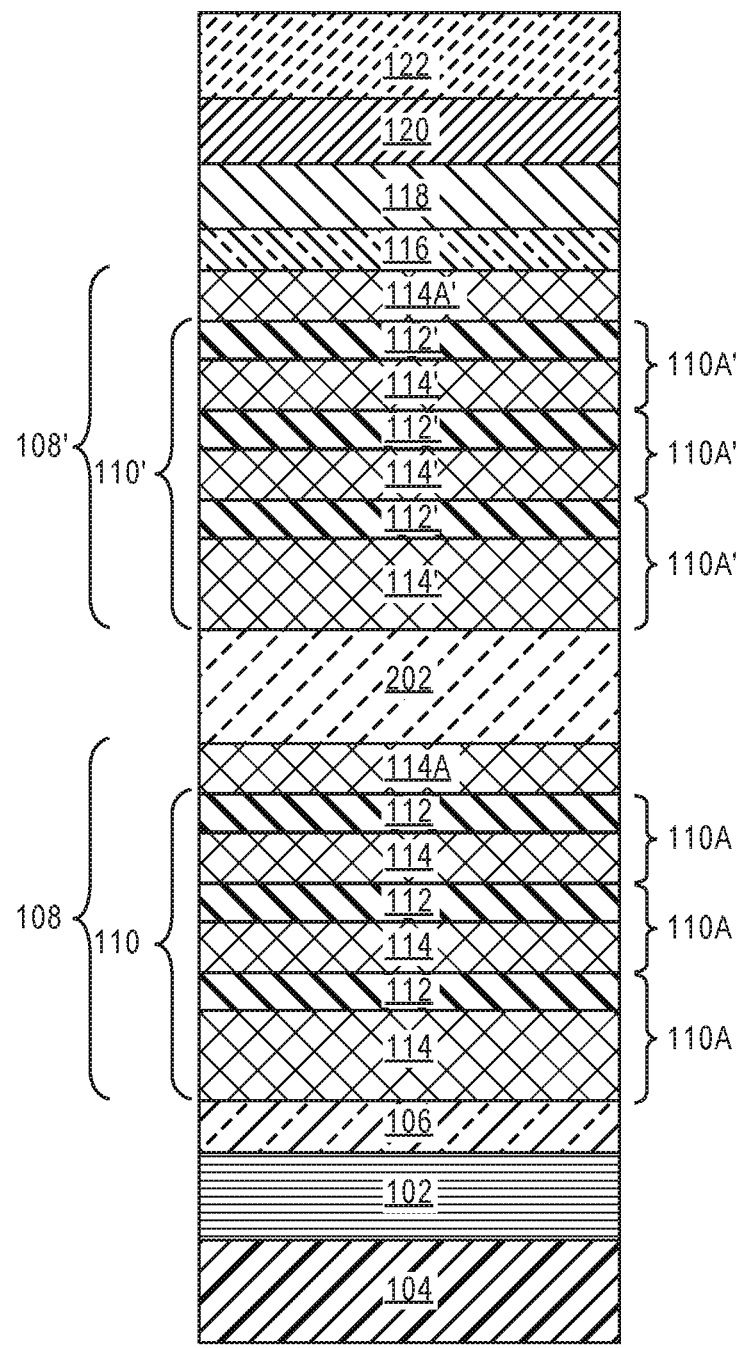

FIG. 4A-4C illustrate cross-sectional views representing various operations in a method of fabricating the pSTTM material layer stack 200C depicted in FIG. 2C.

FIG. 4A illustrates a cross-sectional view following the formation of the fixed magnetic layer 102, the tunnel barrier 106 and the stack of bilayers 110. In an embodiment, the bottom electrode 104 is deposited on a substrate. In an embodiment, the fixed magnetic layer 102, the tunnel barrier 106 and the stack of bilayers 110 and the magnetic layer 114 are sequentially blanket deposited on the bottom electrode 104 by deposition methods that are well known in the art.

In an embodiment, the thickness of the non-magnetic layers 114 and 114' are between 0.01 nm and 0.025 nm. As such the deposition process can yield non-magnetic layers 114 and 114' that are discontinuous.

In an embodiment, the process utilized to deposit the bottom electrode layer 104, the fixed magnetic layer 102, the tunnel barrier 106, the stack of bilayers 110 and the magnetic layer 114 is carried out with no air break. In another embodiment, the bottom electrode layer 104 is first blanket deposited and planarized. The fixed magnetic layer 102, the tunnel barrier 106, the stack of bilayers HO and the magnetic layer 114 are then blanket deposited onto the planarized bottom electrode layer 104.

In an embodiment, the process of depositing the stack of bilayers 110 is carried out in a manner that does not lead to intermixing between the magnetic layer 114 and the non-magnetic layer 112. In an embodiment, the non-magnetic layers 112 are deposited to a thickness such that portions of the non-magnetic layers 112 are discontinuous. In one such embodiment, when the magnetic layer 114 is deposited on such a discontinuous non-magnetic layer 112, portions of the magnetic layers 114 above the non-magnetic layer 112 are in contact with portions of the magnetic layer below the non-magnetic layer 112. Hence, the formation of bilayers with discontinuities in the non-magnetic layers 112 does not enhance interfacial perpendicular anisotropy.

In another embodiment, the SAF layer 220, described above is deposited between the bottom electrode layer 104 and the fixed magnetic layer 102.

FIG. 4B illustrates a cross-sectional view of the formation of a coupling layer 202 and a second free layer 108' including a stack of bilayers 110' above the first free layer 108. In an embodiment, the coupling layer 202 is deposited using a reactive sputter deposition technique and includes a material such as CoFeB. In an embodiment, the coupling layer 202 has a thick between 0.3 nm-0.7 nm. As such a thickness between 0.3 nm-0.7 nm is sufficient enough to form a continuous film of CoFeB coupling layer.

In an embodiment, the materials and methods to form the second free layer 108', including the stack of bilayers 110' and the uppermost magnetic layer 114A' is similar to the methods and materials utilized to form the free layer 108, including the stack of bilayers 110 and the uppermost magnetic layer 114.

In an embodiment, the bottom electrode 104, the fixed magnetic layer 102, the free layer 108, the coupling layer 202 and the second free layer 108' are all deposited in-situ without an air break.

FIG. 4C illustrates a cross-sectional view of the formation of a protective layer 118 on the second free layer 108', a conductive capping layer 120 on the protective layer 118, followed by the formation of a top electrode layer 122 on the conductive capping layer 120.

In an embodiment, the protective layer 118 has a thickness sufficient to withstand against sputter damage during subsequent deposition of the conductive capping layer 120. In an embodiment, the cobalt composition is tuned to a level below 25% relative to the Iron composition, in the CoFeB alloy. In one such embodiment, the resulting $Co_xFe_{1-x}B$ protective layer 118 (where x<0.25) having a thickness of 0.3 to 1.5 nm is a magnetically-dead layer.

In an embodiment, the conductive capping layer 120 includes a metal such as molybdenum or ruthenium. Metals with a lack of oxygen affinity such as molybdenum and ruthenium provide protection against oxygen scavenging from the interface 117 (described in association with FIG. 1). In an embodiment, the conductive capping layer 120 is blanket deposited onto the surface of the protective layer 118, using a low energy physical vapor deposition (PVD) process. In an embodiment, the conductive capping layer 120 is deposited to a thickness of 1.5 nm-5 nm.

In an embodiment, the top electrode layer 122 is blanket deposited on the surface of the conductive capping layer 120. In an embodiment, the top electrode layer 122 includes a material such as Ta. In an embodiment, the thickness of the top electrode layer 122 is between 30-70 nm.

Magnetic measurements of coercivity and TMR may be measured after the material layer stack 200A has been formed. In an embodiment, the coercivity measurements of material layer stack 200A reveals that implementing a stack of bilayers 110 in the free layer 108, increases the coercivity of the material layer stack 200A by almost 35-50% over the use of a free layer 108 having a single layer of magnetic material. An increase in coercivity of the material layer stack 200A is an indication of the enhancement of perpendicular anisotropy and bit stability.

In an embodiment, TMR measurements of the material layer stack 200A, exhibits a similar TMR over the use of a free layer 108 having a single layer of magnetic material.

Figure 5:
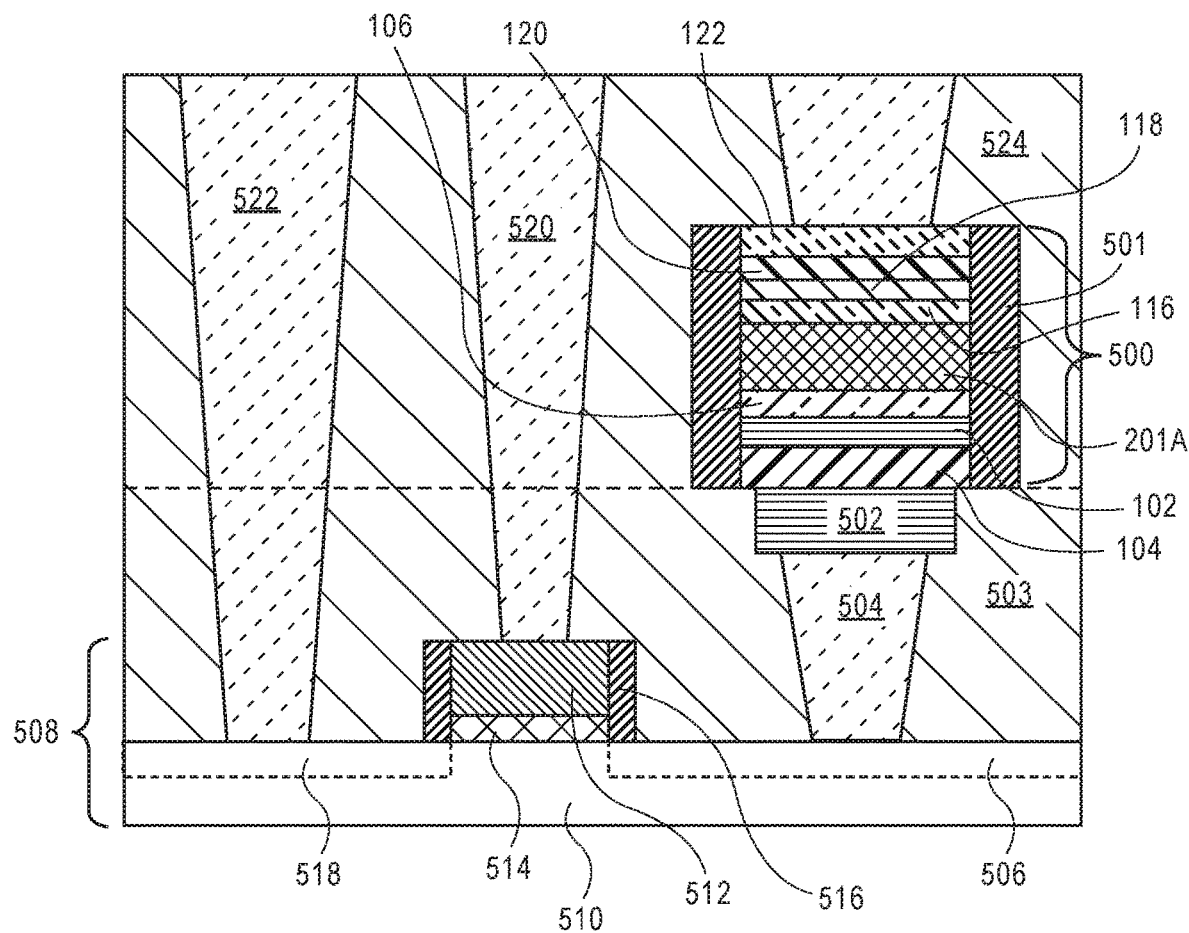
FIG. 5 illustrates a cross-sectional view of a pSTTM device formed on a conductive interconnect coupled to a transistor.

FIG. 5 illustrates a pSTTM device 500, formed on a conductive interconnect 502 disposed on a contact structure 504 above a drain region 506 of an access transistor 508 disposed above a substrate 510. In an embodiment, the material layer stack 200A, described in FIG. 2A, is blanket deposited on a conductive interconnect 502. The material layer stack 200A is lithographically patterned and then etched to form a pSTTM device 500 as is illustrated in FIG. 5. The pSTTM device 500 includes the fixed magnetic layer 102 formed on the bottom electrode layer 104. The tunnel barrier 106 is formed on the fixed magnetic layer 102. The storage layer 201A is formed on the tunnel barrier 106. The oxide layer 116 is formed on the storage layer 201A. The protective layer 118 is formed on the oxide layer 116. The conductive capping layer 120 is formed on the protective layer 118. The top electrode layer 122 is formed on the protective layer 118. In an embodiment, the pSTTM device 500 is surrounded by a dielectric spacer layer 501.

In an embodiment, the underlying substrate 510 represents a surface used to manufacture integrated circuits. Suitable substrate 510 includes a material such as single crystal silicon, polycrystalline silicon and silicon on insulator (SOI), as well as similar substrates formed of other semiconductor materials. The substrate 510 may also include semiconductor materials, metals, dielectrics, dopants, and other materials commonly found in semiconductor substrates.

In an embodiment, the access transistor 508 associated with substrate 510 are metal-oxide-semiconductor field-effect transistors (MOSFET or simply MOS transistors), fabricated on the substrate 510. In various implementations of the invention, the access transistor 508 may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors.

In an embodiment, the access transistor 508 of substrate 510 includes a gate stack formed of at least two layers, a gate dielectric layer 514 and a gate electrode layer 512. The gate dielectric layer 514 may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 514 to improve its quality when a high-k material is used.

The gate electrode layer 512 of the access transistor 508 of substrate 510 is formed on the gate dielectric layer 514 and may consist of at least one P-type workfunction metal or N-type workfunction metal, depending on whether the transistor is to be a PMOS or an NMOS transistor. In some implementations, the gate electrode layer 512 may consist of a stack of two or more metal layers, where one or more metal layers are workfunction metal layers and at least one metal layer is a conductive fill layer.

For a PMOS transistor, metals that may be used for the gate electrode layer 512 include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode 512 may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode 512 may consist of one or more U-shaped metal layers formed atop one or more planar, non-U-shaped layers.

In some implementations of the invention, a pair of sidewall spacers 516 may be formed on opposing sides of the gate stack that bracket the gate stack. The sidewall spacers 516 may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source region 518 and drain region 506 are formed within the substrate adjacent to the gate stack of each MOS transistor. The source region 518 and drain region 506 are generally formed using either an implantation/diffusion process or an etching/deposition process. In the former process, dopants such as boron, aluminum, antimony, phosphorous, or arsenic may be ion-implanted into the substrate to form the source region 518 and drain region 506. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source region 518 and drain region 506. In some implementations, the source region 518 and drain region 506 may be fabricated using a silicon alloy such as silicon germanium or silicon carbide. In some implementations the epitaxially deposited silicon alloy may be doped in situ with dopants such as boron, arsenic, or phosphorous. In further embodiments, the source region 518 and drain region 506 may be formed using one or more alternate semiconductor materials such as germanium or a group material or alloy. And in further embodiments, one or more layers of metal and/or metal alloys may be used to form the source region 518 and drain region 506.

In an embodiment, a gate contact 520 and a source contact 522 are formed above the gate electrode 512 and source region 518 respectively.

Figure 6:
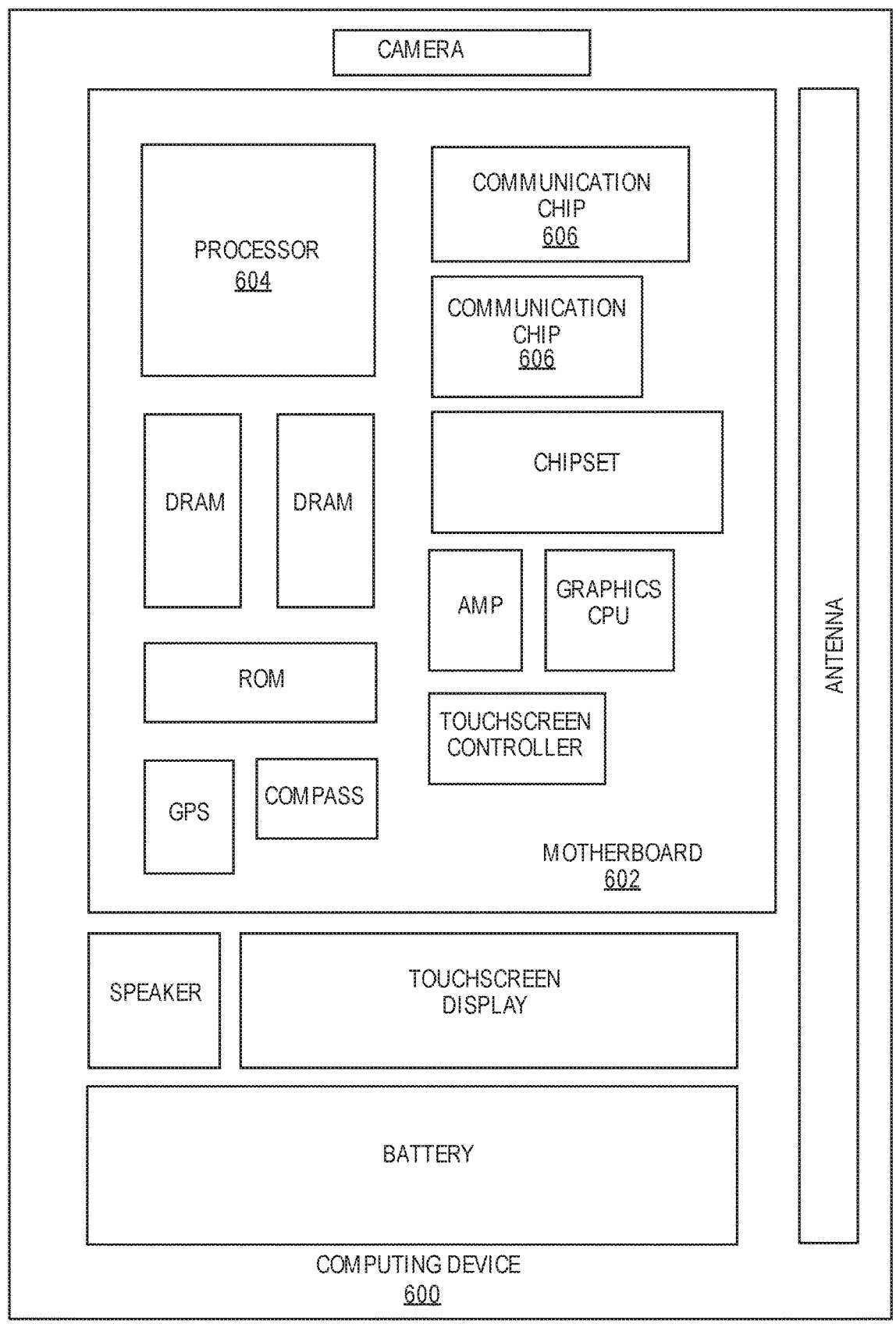
FIG. 6 illustrates a computing device in accordance with embodiments of the present invention.

FIG. 6 illustrates a computing device 600 in accordance with one embodiment of the invention. The computing device 600 houses a motherboard 602. The motherboard 602 may include a number of components, including but not limited to a processor 604 and at least one communication chip 606. The processor 604 is physically and electrically coupled to the motherboard 602. In some implementations the at least one communication chip 606 is also physically and electrically coupled to the motherboard 602. In further implementations, the communication chip 606 is part of the processor 604.

Depending on its applications, computing device 600 may include other components that may or may not be physically and electrically coupled to the motherboard 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of embodiments of the invention, the integrated circuit die of the processor includes one or more memory elements, such as a pSTTM device 500, built with a pSTTM material layer stack 200C in accordance with embodiments of the present invention. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of an embodiment of the invention, the integrated circuit die of the communication chip includes pSTTM device integrated with access transistors, built in accordance with embodiments of the present invention.

In further implementations, another component housed within the computing device 600 may contain a stand-alone integrated circuit memory die that includes one or more memory elements, built in accordance with embodiments of the present invention.

In various implementations, the computing device 600 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Accordingly, one or more embodiments of the present invention relate generally to the fabrication of embedded microelectronic memory. The microelectronic memory may be non-volatile, wherein the memory can retain stored information even when not powered. One or more embodiments of the present invention relate to the fabrication of a pSTTM material layer stack 200C. Such pSTTM material layer stack 200C may be used in an embedded non-volatile memory application.

Thus, embodiments of the present invention include perpendicular-spin transfer torque memory (pSTTM) devices with enhanced perpendicular anisotropy and methods of fabrication are described. Thus, embodiments of the present invention include perpendicular-spin transfer torque memory (pSTTM) devices with enhanced perpendicular anisotropy and methods of fabrication are described.

Example 1

A material layer stack for a pSTTM device including a fixed magnetic layer and a tunnel barrier disposed above the fixed magnetic layer. A free layer is disposed on the tunnel barrier, wherein an uppermost bilayer is capped by a magnetic layer, where each of the bilayers includes a non-magnetic layer is disposed on a magnetic layer and where the non-magnetic layers in the stack of bilayers have a combined thickness that is less than 15% of a combined thickness of the magnetic layers in the stack of bilayers.

Example 2

The material layer stack of example 1, wherein the number of bilayers is at least 2.

Example 3

The material layer stack of example: 1 or 2; wherein the number of bilayer stacks is between 2-12.

Example 4

The material layer stack of example 1, 2 or 3, wherein the non-magnetic layers in the stack of bilayers have a combined thickness that is less than 5% of the combined thickness of each of the magnetic layers in the plurality of the bilayers.

Example 5

The material layer stack of example 1, 2, 3 or 4, wherein the magnetic layer in a lowermost bilayer is in contact with the tunnel barrier and has a thickness that is greater than the thickness of each of the magnetic layers in the stack of bilayers not in contact with the tunnel barrier.

Example 6

The material layer stack of example 1, 2, 3, 4 or 5, wherein the magnetic layer in contact with the tunnel barrier has a thickness that is at least 0.45 nm.

Example 7

The material layer stack of example 1, 2, 3, 5 or 6, wherein the combined thickness of the magnetic layers in the free layer is at least 1.0 nm.

Example 8

The material layer stack of example 1, 2, 3 or 4, wherein each of the non-magnetic layers in the stack of bilayers is a monolayer.

Example 9

The material layer stack of example 1, 2, 3, 4 or 8, wherein the combined thickness of the non-magnetic layers in the stack of bilayers is at least 0.05 nm.

Example 10

The material layer stack of example 1, 2, 3, 4, 5, 6 or 7, wherein the magnetic layer comprises cobalt, boron and iron.

Example 11

The material layer stack of example 1, 2, 3, 8 or 9, wherein the non-magnetic layer comprises a metal selected from the group consisting of molybdenum, ruthenium, tungsten, tantalum and aluminum.

Example 12

The material layer stack of example 1, wherein the material layer stack further includes an oxide layer disposed on the free layer. A protective layer is disposed on the oxide layer and a conductive capping layer is disposed directly on the protective layer.

Example 13

A material layer stack for a pSTTM device includes a fixed magnetic layer and a tunnel barrier disposed above the fixed magnetic layer. A storage layer is disposed on the tunnel barrier. The storage layer comprises a first free layer disposed on the tunnel barrier. A coupling layer is disposed on the first free layer and a second free layer is disposed on the coupling layer, wherein one of the first free layer or the second free layer includes a stack of bilayers. An uppermost bilayer stack is capped by a magnetic layer, and each of the bilayers includes a non-magnetic layer disposed on a magnetic layer and wherein the non-magnetic layers in the stack of bilayers have a combined thickness that is less than 15% of a combined thickness of the magnetic layers in the stack of the bilayers.

Example 14

The material layer stack of example 13, wherein the first free layer includes the stack of bilayers and the second free layer comprises a single magnetic layer.

Example 15

The material layer stack of example 13 or 14, wherein the second free layer includes a second stack of bilayers capped by a magnetic layer and wherein each of the second stack of bilayers includes a non-magnetic layer disposed on a magnetic layer. The magnetic layers in the second stack of bilayer have a combined thickness that is less than the combined total thickness of the magnetic layers in the stack of bilayers in the first magnetic layer.

Example 16

The material layer stack of example 13, wherein the first free layer includes a single magnetic layer and the second free layer includes the stack of bilayers and wherein the combined thickness of the magnetic layers in the second free layer is less than the thickness of the first free layer that includes a single magnetic layer.

Example 17

The material layer stack of example 13, wherein the stack of bilayers formed in the first free layer has a lower most magnetic layer in contact with the tunnel barrier. The thickness of the lowermost magnetic layer is greater than the thickness of each of the magnetic layers in the stack of bilayers not in contact with the tunnel barrier.

Example 18

The material layer stack of example 13, 14 or 17, wherein the combined total thickness of the magnetic layers in the first free layer is at least 1.0 nm and wherein the lowermost magnetic layer in the first free layer has a thickness that is at least 0.45 nm.

Example 19

The material layer stack of example 13, 14, or 17, wherein the combined total thickness of the non-magnetic layer in the first or in the second free layer is at least 0.045 nm.

Example 20

The material layer stack of example 13, wherein the magnetic layer includes cobalt, boron and iron and wherein the non-magnetic material is selected from the group consisting of molybdenum, ruthenium, tungsten, tantalum and aluminum.

Example 21

The material layer stack of example 13 includes a conductive oxide layer disposed on the storage layer. A protective layer is disposed on the conductive oxide layer and a conductive capping layer is disposed directly on the protective layer. A bottom electrode layer is disposed below the fixed magnetic layer and a top electrode layer is disposed above the capping layer. A synthetic antiferromagnetic layer is disposed between the fixed layer and the bottom electrode layer.

Example 22

A method of fabricating a material layer stack for a non-volatile memory device includes forming a bottom electrode layer. The method includes forming a fixed magnetic layer. The method includes forming a tunnel barrier on fixed magnetic layer. A storage layer is formed on the tunnel barrier, wherein forming the storage layer further includes forming a first free layer on the tunnel barrier, forming a coupling layer on the first free layer, forming a second free layer on the coupling layer, forming a stack of bilayers in one of the first free layer or the second free layer. The method of forming each of the bilayer stacks further includes forming a non-magnetic layer on a magnetic layer and capping an uppermost bilayer stack with the magnetic layer. The method includes forming a conductive oxide layer on the coupling layer and forming a protective layer on the conductive oxide layer. The method includes forming a conductive capping directly on the protective layer. The method includes forming a top electrode layer on the conductive capping layer.

Example 23

The method of example 22, wherein forming the stack of bilayers includes forming the stack of bilayers in the first free layer.

Example 24

The method of example 23, wherein forming a second stack of bilayers, includes forming a second stack of bilayers in the second free layer capped by a magnetic layer. Each of the second stack of bilayers includes a non-magnetic layer disposed on a magnetic layer and wherein the non-magnetic layers in the second stack of bilayers have a combined thickness that is less than 15% of a combined thickness of the magnetic layers in the second stack of bilayers.

What is claimed is:

1. A material layer stack for a pSTTM device, the material layer stack comprising:
    a fixed magnetic layer; a tunnel barrier disposed above the fixed magnetic layer; and
    a free layer disposed on the tunnel barrier, wherein the free layer comprises a stack of bilayers, wherein an uppermost bilayer is capped by a magnetic layer, wherein each of the bilayers comprises a non-magnetic layer disposed on a magnetic layer, wherein the magnetic layer in a first of the bilayers has a thickness that is greater than a thickness of the magnetic layer in a second of the bilayers.

2. The material layer stack of claim 1, wherein the number of bilayers is at least 2.

3. The material layer stack of claim 1, wherein the number of bilayer stacks is between 2-12.

4. The material layer stack of claim 1, wherein the non-magnetic layers in the stack of bilayers have a combined thickness that is less than 5% of the combined thickness of each of the magnetic layers in the stack of the bilayers.

5. The material layer stack of claim 1, wherein the magnetic layer in the first of the bilayers is in contact with the tunnel barrier.

6. The material layer stack of claim 5, wherein the magnetic layer in contact with the tunnel barrier has a thickness that is at least 0.45 nm.

7. The material layer stack of claim 1, wherein the combined thickness of the magnetic layers in the free layer is at least 1.0 nm.

8. The material layer stack of claim 1, wherein the non-magnetic layers in the stack of bilayers have a combined thickness that is less than 15% of a combined thickness of the magnetic layers in the stack of bilayers.

9. The material layer stack of claim 1, wherein the combined thickness of the non-magnetic layers in the stack of bilayers is at least 0.05 nm.

10. The material layer stack of claim 1, wherein the magnetic layer comprises cobalt, boron and iron.

11. The material layer stack of claim 1, wherein the non-magnetic layer comprises a metal selected from the group consisting of but not limited to molybdenum, ruthenium, tungsten, tantalum, aluminum and hafnium.

12. The material layer stack of claim 1, wherein the material layer stack further comprises:
    an oxide layer disposed on the free layer;
    a protective layer disposed on the oxide layer; and
    a conductive capping layer.

13. A material layer stack for a pSTTM device, the material layer stack comprising:
    a fixed magnetic layer;
    a tunnel barrier disposed above the fixed magnetic layer;
    a storage layer disposed on the tunnel barrier, wherein the storage layer comprises a first free layer disposed on the tunnel barrier, a coupling layer disposed on the first free layer, a second free layer disposed on the coupling layer, wherein one of the first free layer or the second free layer comprises a stack of bilayers, wherein an uppermost bilayer stack is capped by a magnetic layer, wherein each of the bilayers comprises a non-magnetic layer disposed on a magnetic layer, wherein the magnetic layer in a first of the bilayers has a thickness that is greater than a thickness of the magnetic layer in a second of the bilayers.

14. The material layer stack of claim 13, wherein the first free layer comprises the stack of bilayers and the second free layer comprises a single magnetic layer.

15. The material layer stack of claim 14, wherein the second free layer comprises a second stack of bilayers capped by a magnetic layer, wherein each of the second stack of bilayers comprises a non-magnetic layer disposed on a magnetic layer and wherein the magnetic layers in the second stack of stack of bilayer have a combined thickness that is less than that of the combined thickness of the magnetic layers in the stack of bilayers in the first magnetic layer.

16. The material layer stack of claim 13, wherein the first free layer comprises a single magnetic layer and the second free layer comprises the stack of bilayers and wherein the combined thickness of the magnetic layers in the second free layer is less than the thickness of the first free layer that comprises a single magnetic layer.

17. The material layer stack of claim 13, wherein the stack of bilayers formed in the first free layer has the magnetic layer of the first of the bilayers in contact with the tunnel barrier.

18. The material layer stack of claim 13, wherein the combined total thickness of the magnetic layers in the first free layer is at least 1.0 nm and wherein the lowermost magnetic layer in the first free layer has a thickness that is at least 0.45 nm.

19. The material layer stack of claim 13, wherein the combined total thickness of the non-magnetic layer in the first or in the second free layer is at least 0.045 nm.

20. The material layer stack of claim 13, wherein the magnetic layer comprises cobalt, boron and iron and wherein the non-magnetic material is selected from the group consisting of molybdenum, ruthenium, tungsten, tantalum and aluminum.

21. The material layer stack of claim 13, wherein the material layer stack further comprises:
a conductive oxide layer disposed on the storage layer;
a protective layer disposed on the conductive oxide layer;
a conductive capping layer;
a bottom electrode layer disposed below the fixed;
a top electrode layer disposed above the capping layer; and
a synthetic antiferromagnetic layer is disposed between the fixed layer and the bottom electrode layer.

22. The material layer stack of claim 13, wherein the non-magnetic layers in the stack of bilayers have a combined thickness that is less than 15% of a combined thickness of the magnetic layers in the stack of the bilayers.

23. A method of fabricating a material layer stack for a non-volatile memory device, the method comprising:
forming a bottom electrode layer;
forming a fixed magnetic layer; forming a tunnel barrier on fixed magnetic layer;
forming a storage layer, wherein forming a storage layer further comprises forming a first free layer on the tunnel barrier, forming a coupling layer on the first free layer, forming a second free layer on the coupling layer, forming a stack of bilayers in one of the first free layer or the second free layer, wherein each of the bilayer stacks further comprises forming a non-magnetic layer on a magnetic layer and capping an uppermost bilayer stack with the magnetic layer; forming a conductive oxide layer on the coupling layer;
forming a protective layer on the conductive oxide layer;
forming a conductive capping directly on the protective layer;
forming a top electrode layer on the conductive capping layer.

24. The method of claim 23, wherein forming the stack of bilayers includes forming the stack of bilayers in the first free layer.

25. The method of claim 24, wherein forming a second stack of bilayers, includes forming a second stack of bilayers in the second free layer capped by a magnetic layer, wherein each of the second stack of bilayers comprises a non-magnetic layer disposed on a magnetic layer and wherein the non-magnetic layers in the second stack of bilayers have a combined thickness that is less than 15% of a combined thickness of the magnetic layers in the second stack of bilayers.

* * * * *